United States Patent [19]

Bironas et al.

[11] Patent Number: 5,513,268
[45] Date of Patent: Apr. 30, 1996

[54] VARIABLE DIGITAL CONTROL FOR ELECTRONIC DEVICE WITH ROTARY SWITCH CONTROL

[75] Inventors: Dennis K. Bironas, Kokomo; James R. Bradley, Peru; Wilbur A. Robarge, Greentown, all of Ind.

[73] Assignee: Delco Electronics Corporation, Kokomo, Ind.

[21] Appl. No.: 179,300

[22] Filed: Jan. 10, 1994

[51] Int. Cl.$^6$ .................................................. G06F 3/03
[52] U.S. Cl. .................................................. 381/109; 381/104
[58] Field of Search .................................................. 381/104–109; 323/318

[56] References Cited

U.S. PATENT DOCUMENTS

| | | | |
|---|---|---|---|
| 4,239,938 | 12/1980 | Ponto | 381/104 |
| 4,270,177 | 5/1981 | Endoh et al. | 364/571 |
| 4,349,779 | 9/1982 | Ono | 323/318 |
| 4,412,182 | 10/1983 | Yochum | 330/59 |
| 4,527,230 | 7/1985 | Sato et al. | 323/318 |
| 4,611,344 | 9/1986 | Hayama et al. | 381/109 |
| 4,706,294 | 11/1987 | Ouchida | 381/109 |
| 5,010,577 | 4/1991 | Sakanishi et al. | 381/104 |
| 5,081,682 | 1/1992 | Kato et al. | 381/57 |

FOREIGN PATENT DOCUMENTS

| | | | |
|---|---|---|---|
| 57-161657 | 10/1982 | Japan | G01P 13/04 |
| 59-222767 | 12/1984 | Japan | G01P 13/04 |
| 2125645 | 3/1984 | United Kingdom | H03K 13/02 |

*Primary Examiner*—Stephen Brinich
*Attorney, Agent, or Firm*—Jimmy L. Funke

[57] ABSTRACT

A digital control device and method are provided for controlling functions such as volume and tuning for an electronic radio in response to a digital rotary switch. The apparatus includes a digital switch movable to a plurality of positions and which has a plurality of digital outputs to represent the positions. Control increments corresponding to an amount of rotation and rate of rotation of the switch are stored in a memory. The rotary switch output is periodically sampled to determine when switch movement occurs and to further determine the direction of switch rotation based on a sequence of the plurality of digital outputs. The rate of rotation of the rotary switch is then determined from counting changes in position of the switch over a sampling time A control increment is looked up in the memory that corresponds to the determined rate. The control increment is then used to change a digital output signal for controlling the electronic device. The digital output signal may control volume for an electronic radio or may include a tuner selector for selecting the tuning frequency of a radio. Accordingly, the present invention enables one to have variable control of radio functions in accordance with predetermined rates of rotation of a digital rotary switch.

9 Claims, 3 Drawing Sheets

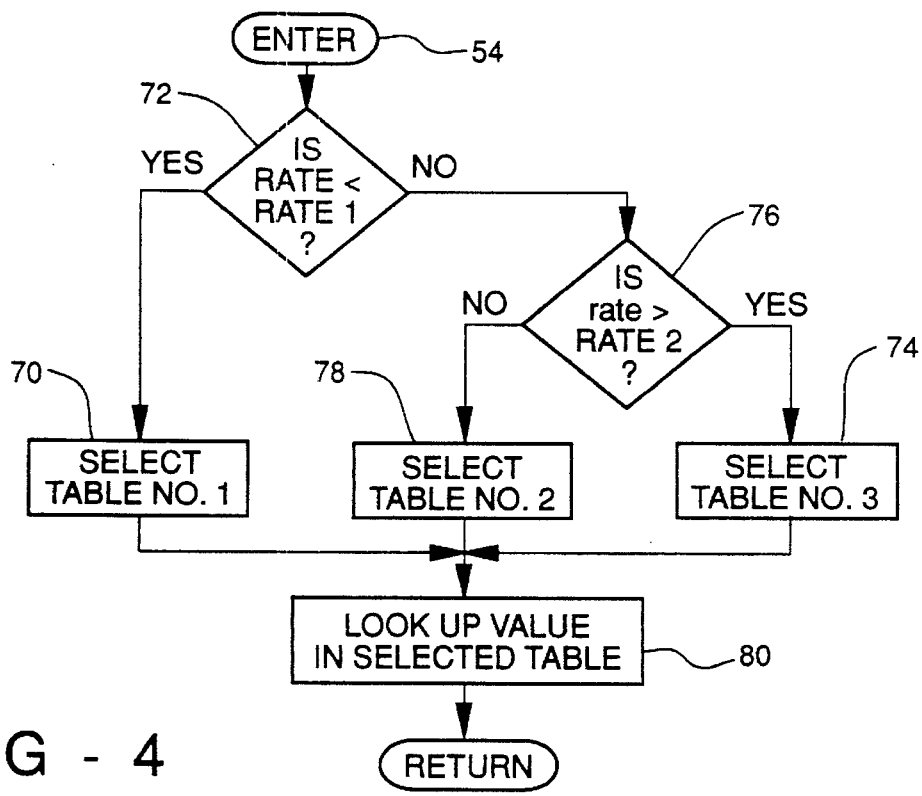
FIG - 4
FIG - 5
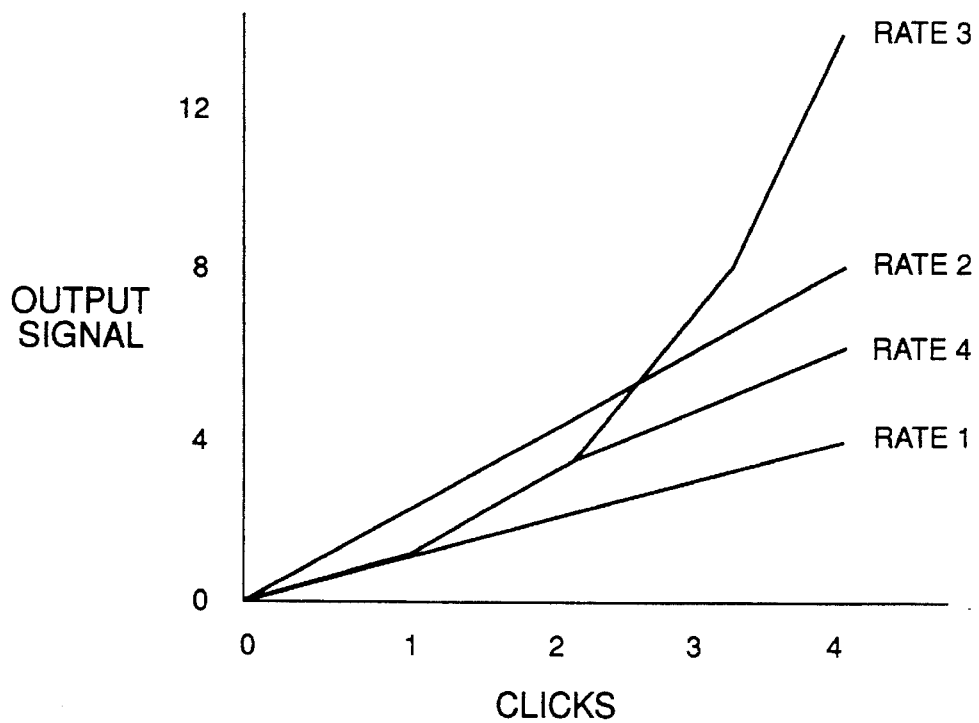

VARIABLE DIGITAL CONTROL FOR ELECTRONIC DEVICE WITH ROTARY SWITCH CONTROL

BACKGROUND OF THE INVENTION

1. Technical Field

This invention relates generally to digital control and, more particularly, to adaptive digital control of an electronic device in response to a rotary digital switch input.

2. Discussion

Electronic sound systems such as radios commonly employ pushbutton or rotary controls to manually vary the system operation. Pushbutton controls offer a quick response but generally are not all that versatile since values between the preset parameter values are generally not available. Conventional analog controls have included the use of rotary potentiometers and variable resistors which offer the advantage of an infinitesimal adjustment capability, but generally do have drawbacks associated therewith. Over time the potentiometer will typically gather surface film, accumulate dust and the operation will tend to become noisy, open and/or intermittent.

In order to use an analog control with a microcomputer, an analog to digital converter is generally required to convert the analog voltage to a digital voltage. Modern radios and, in particular, those employed in automobiles tend to employ microcomputer control technology. Thus, it is generally desirable to have controls which can easily interface with a microcomputer and advantageously utilize the superior digital control capabilities associated therewith.

It is generally known to use a rotary switch with a digital output as a radio volume control or a tuner selector in a microcomputer controlled system. Such a rotary switch can be rotated in either a clockwise or counter-clockwise direction to close switch contacts which are arranged in fixed angular increments. Each switch contact position outputs one of three digital numbers according to a predetermined sequence. By evaluating the change in the numbers during rotation, the microcomputer can determine the direction of rotation and the amount of rotation and then change the tuning or volume control signal accordingly. This is generally accomplished without noise interference or other adverse effects commonly associated with prolonged use and aging for other types of switches.

A disadvantage of the conventional rotary switch arrangement is that for a tuner control each angular increment must result in a signal change small enough for tuning to every station, and consequently much rotation is required to traverse the entire tuning bandwidth of the radio. This limitation is particularly annoying in the case of a volume control. It is sometimes desirable to quickly change the volume to reach the sound level that is most enjoyable to the user. Say, for instance when first turning on the radio system, the previous user has left the volume control set to a highly uncomfortable audio level. The present user would like to have the ability to quickly reduce the audio level to a more comfortable level. Yet, it is also desirable to have the ability to make small volume adjustments. Thus, it is desired to have both fine and coarse control with the same control switch.

It is therefore one object of the present invention to provide for a digital control for an electronic radio which has functions controlled in response to a rotary switch that produces a digital control signal.

It is another object of the present invention to provide for an enhanced digital control which enables a user to variably control the volume of a radio via a digital switch.

It is a further object of the present invention to provide for such an enhanced digital control which enables a user to variably control a tuner selector of a radio via a digital switch.

Yet, it is still a further object of the present invention to provide for both fine and coarse control capability to handle the above operations with a single digital switch for each control function.

SUMMARY OF THE INVENTION

In accordance with the teachings of the present invention, a control apparatus is provided for controlling an electronic device such as a radio in response to a rotary control switch. The apparatus includes a digital rotary switch that is moveable to a plurality of positions and has a plurality of digital outputs to represent the positions. Control increments are stored in memory and correspond to the amount of rotation and the rate of rotation of the switch. The apparatus periodically samples the switch output to determine switch movement and then counts the number of positions over a sampling time to determine a rate of rotation of the switch. The direction of switch rotation is also determined from the sequence of digital outputs. An amount of change in control signal output is looked up in memory according to the corresponding predetermined rate. The change in control signal output is then applied to a control signal for controlling the electronic device.

BRIEF DESCRIPTION OF THE DRAWINGS

Other objects and advantages of the present invention will become apparent to those skilled in the art upon reading the following detailed description and upon reference to the drawings in which:

FIG. 4 is a flow diagram which illustrates a subroutine of the program shown in FIG. 3 for selecting a look-up table; and FIG. 5 is a graphical representation of clicks versus output signal for a number of angular velocities (i.e., rates) which may be programmed in the look-up tables.

DETAILED DESCRIPTION OF THE PREFERRED EMBODIMENTS

While the following description is directed to a digital control device which is specifically designed for use as a volume control and a tuner control for a radio, the present invention may apply as well to other microcomputer based electronic systems. The use of a commercially available digital switch which yields outputs that can be tailored by stored conversion table or functions according to a number of predetermined rates and used with the software control described herein may be attractive for a number of applications.

Figure 1:
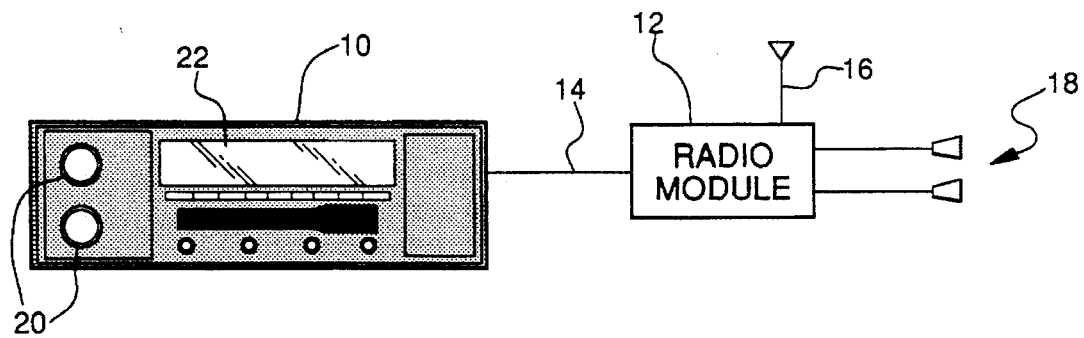
FIG. 1 is a block diagram of a prior art radio system adapted for use with the subject invention.

Turning now to FIG. 1, a well known automotive radio system is shown therein according to the prior art which includes a control head 10 connected to a radio module 12 via a data bus 14. An antenna 16 and speakers 18 are also connected to the radio module 12. The tuning of the radio module 12 as well as the volume control, fade and balance controls and other controllable functions are controlled by control head 10 which in turn sends control signals to the radio module 12 in the form of digital data via the data bus 14.

The control head 10 includes manually rotatable control knobs 20 for providing manual selection of each user controllable function. That is, control knobs 20 are manually rotatable to control the volume setting or tuner selection for the radio system. In addition, the control head 10 also includes a display 22 which shows at least the selected tuner radio frequency and may also graphically depict the volume and other functions such as time, etc.

Figure 2:
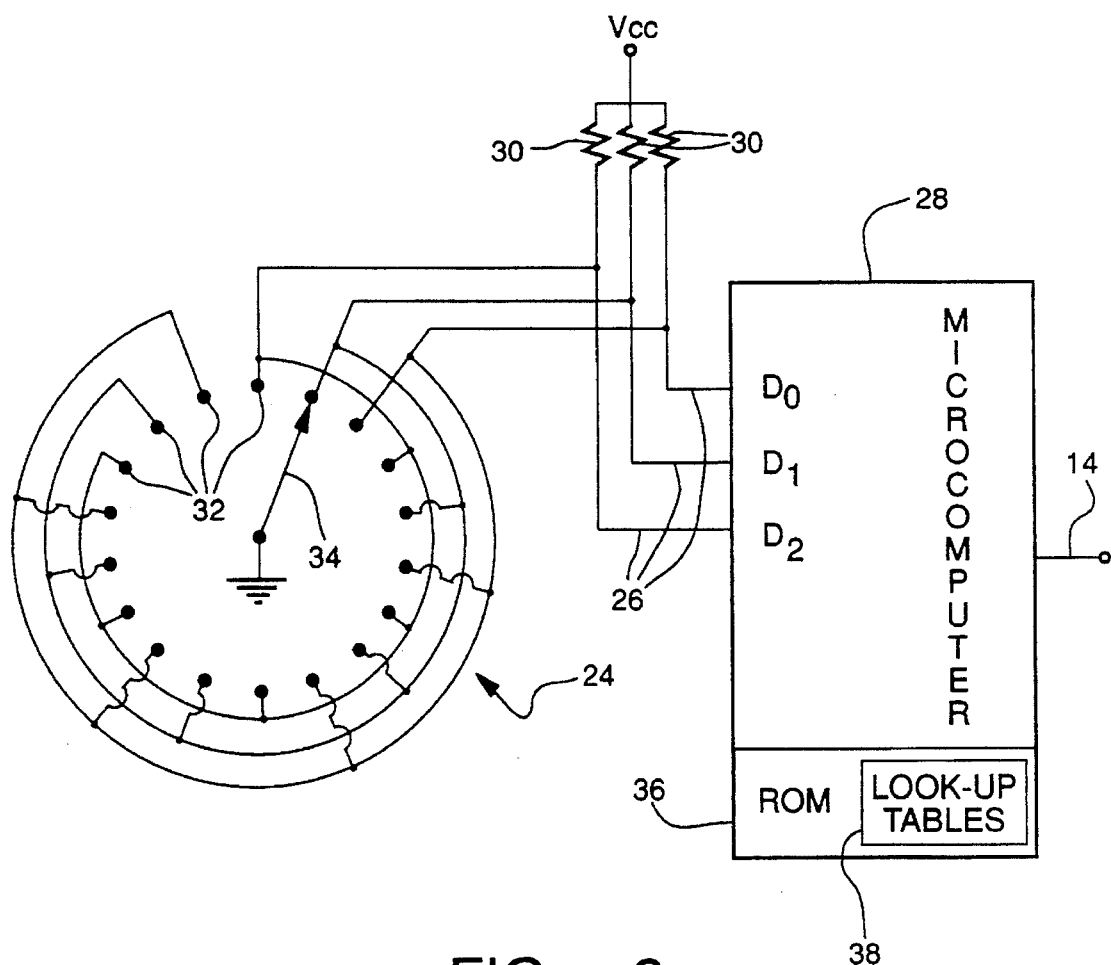
FIG. 2 is a schematic diagram of a digital rotary switch and microcomputer control for the system of FIG. 1 with provision to accommodate the present invention.

The radio system as shown operates such that an operator manually selects input settings for volume and tuner control via rotational adjustment of the control knobs 20. Digital output signals are generated in response to each of the control knobs 20 and are carried by the data bus 14 to communicate the operator settings to the radio module 12. For volume control, the digital output signal is generally a number ranging from zero to sixty-three with zero corresponding to the lowest volume setting and sixty-three corresponding to the highest volume setting. Thus, by changing a digital volume setting, the control head 10 commands the radio module 12 to change the volume according to the digital signal. The same method applies for tuner control, where the digital output signal may range between approximately zero and one-hundred to cover the entire FM broadcast frequency bandwidth of operation. Referring to FIG. 2, a digital rotary control switch 24 is shown connected to three inputs $D_0$, $D_1$ and $D_2$ of a microcomputer 28 via three signal lines 26. Rotary control switch 24 is located in control head 10 and is operatively coupled to one of control knobs 20. The microcomputer 28 is preferably located in the control head 10 and is of the type employed in digital automotive radio systems. Each of the three signal lines 26 are connected to a power supply $V_{cc}$ via resistors 30. The digital switch 24 is arranged so that the three signal lines 26 provide a positive voltage on two of the inputs and a zero volt ground on the remaining third input. The microcomputer 28 is programmed to respond to changes in the three inputs $D_0$, $D_1$ and $D_2$ received from lines 26 to determine the correct digital control signal to place on the data bus 14 in response to a change of input.

The digital rotary control switch 24 includes a circular array of equiangular spaced contacts 32. Each of the contacts 32 are connected to one of signal lines 26 in sequence so that every third contact 32 is coupled to one of the lines 26. A grounded wiper 34 is located in the center of the angular array of contacts 32 and is rotatably controlled by one of the manually operated control knobs 20. The wiper 34 is rotatably moveable from one contact to the next contact in response to rotation of knob 20. Wiper movement may be in either a clockwise or counter-clockwise direction without any limit on the amount of rotation that may be applied. Accordingly, the rotation of wiper 34 advances the inputs on signal lines 26 through the sequence of digital signals on inputs $D_0$, $D_1$ and $D_2$ equal to the following: 0 1 1, 1 0 1, 1 1 0, 0 1 1 and so on for continued knob rotation in one direction.

The sequence may be reversed for rotation of wiper 34 in the opposite direction.

By decoding the sequence of digital numbers on the three signal lines 26, the microcomputer 28 and associated software can determine the knob direction of rotation and make a suitable change in the digital control signal on data bus 14 for each time a new input is received. In doing so, only valid inputs are considered; i.e., the 1 1 1 condition where the wiper 34 is traversing between contacts 32 is ignored. In addition, a mechanical detent (not shown) on the switch 24 causes the wiper 34 to prefer a position at each contact 32. Thus, the wiper "clicks" into contact with contact 32. Accordingly, each click corresponds to a predetermined degree of change of rotation in the position of wiper 34. The term "click" is used herein to mean the switch position change event between each of contacts 32. While a particular digital switch is shown, other types of digital rotary switches may be employed to generate a digital number sequence. For instance, wiper 34 could be connected to a strobe instead of ground.

As thus far described, the FIG. 2 arrangement is generally known in the art. However, for each click of the digital switch 24 in the prior art systems, the control signal on the data bus 14 generally changes by an increment of one in either direction. According to the prior art, a user is generally able to achieve fine control adjustment only. The present invention overcomes difficulties associated with the prior art and allows a user to achieve variable control which offers both fine and coarse control capability.

For purposes of the present invention, the microcomputer 28 includes or is connected to a memory device such as a read only memory (ROM) 36. The ROM 36 in turn preferably includes a plurality of look-up tables 38 or conversion tables which are referenced by the number of clicks accumulated in the microcomputer 28 over a predetermined sampling period and is therefore based on a rate of switch rotation. Each of the look-up tables 38 has a conversion function which dictates the increment size for the change in the control signal on data bus 14. A variety of control characteristics can be programmed into the look-up tables 38 to achieve special results such as variable rates of output changes based on selected functions. The microcomputer 28 is programmed to operate so as to select the proper look-up table 38 based on a detected rate and increment the control signal output on data bus 14 according to the net change provided by the look-up table 38.

The look-up table 38 determines the net change in the output signal as a function of the number of clicks detected over a sampling time which is referred to as the click rate. Each look-up table may be programmed with predetermined rates of change which enable a user to accommodate any number of rates. For instance, examples of look-up tables may include the four following look-up tables, each of which are based on different rates Rate 1, Rate 2, Rate 3 and Rate 4.

| CLICKS | INCREMENT | NET CHANGE |
|---|---|---|
| | CLICK RATE 1 | |
| 1 | 1 | 1 |
| 2 | 1 | 2 |
| 3 | 1 | 3 |
| 4 | 1 | 4 |
| | CLICK RATE 2 | |
| 1 | 2 | 2 |
| 2 | 2 | 4 |
| 3 | 2 | 6 |
| 4 | 2 | 8 |

-continued

| CLICKS | INCREMENT | NET CHANGE |
|---|---|---|
| | CLICK RATE 3 | |
| 1 | 1 | 1 |
| 2 | 2 | 3 |
| 3 | 4 | 7 |
| 4 | 8 | 15 |
| | CLICK RATE 4 | |
| 1 | 1 | 1 |
| 2 | 2 | 3 |
| 3 | 2 | 5 |
| 4 | 2 | 7 |
| 5 | 2 | 9 |
| 6 | 2 | 11 |
| 7 | 1 | 12 |

The above-shown look-up tables have click rate 1, rate 2, rate 3 and rate 4 which are graphically depicted by the curves shown in FIG. 5 in terms of the number of clicks counted within one sampling time period versus net change in output control signal. Accordingly, the change in output control signal may variably change depending on the rate in which a user rotates the control knob 20. Therefore, the output signal is incremented based upon the amount of net change in rotation over a sampling period and is therefore based on the angular velocity of rotation of control knob 20.

Click rate 1 provides a linearly increasing net change in output with a one-to-one ratio while click rate 2 shows a two-to-one ratio. If a rapidly increasing conversion table were desired, the conversion function might be designed such as that provided by click rate 3. As shown with click rate 3, one click yields an increment of one; two clicks each yield two increments, three clicks each yield four increments, four clicks each yield eight increments, etc. These changes are cumulative so that with two clicks the net change is three increments, with three clicks the net change is seven increments, etc. Click rate 1, rate 2 and rate 3 are preferably used in conjunction with one another to provide low, medium and high ranges for a given application.

Click rate 4 illustrates a variably changing rate that a user may select for a desired application. According to rate 4, one click may yield an increment of one, two through six clicks may each yield an increment of two; and seven or more clicks each yield an increment of one. This allows a user to achieve fine adjustment for one click, faster adjustment for a moderate number of clicks, and slower adjustment for a high number of clicks. The algorithm is essentially designed to accelerate the output increments by a factor of 2n (where n equals number of clicks) for rates of two through six clicks per sampling time. A user may likewise select one of rate 1, rate 2, or rate 3 as the only rate from which net change may be derived from.

Figure 3:
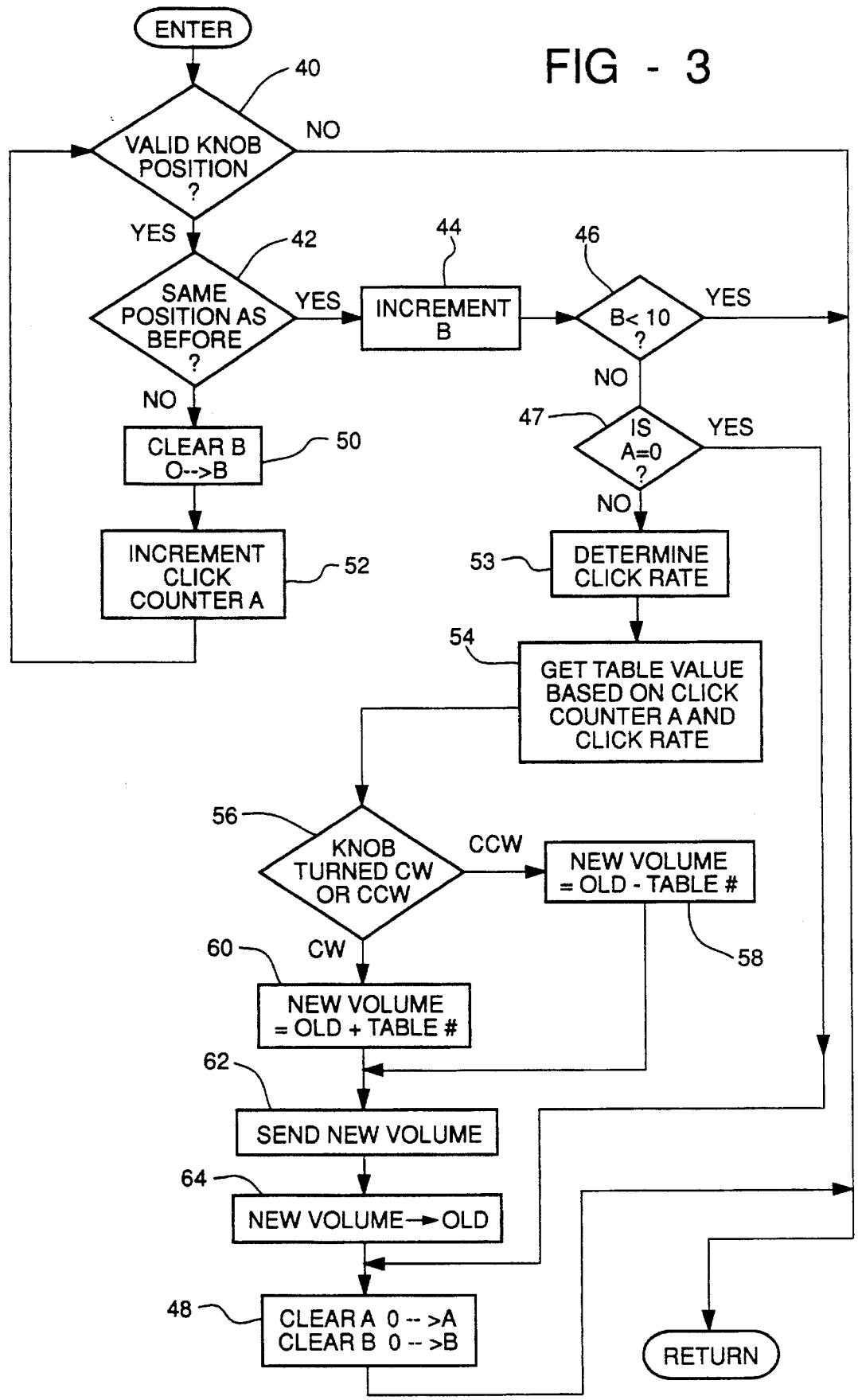
FIG. 3 is a flow diagram which illustrates a program for controlling the microcomputer of FIG. 2 according to the present invention.

With particular reference to FIG. 3, a flow diagram is shown therein which represents a computer program that may be used to accomplish the detection of the number of clicks, determination of the click rate and the look-up of the proper conversion amount. In the flow diagram, description of the reference numerals nn on the block are used in angle brackets<nn> to refer to the functions of the corresponding blocks. The main radio control loop runs the volume routine approximately every five milliseconds. At this rate, every click of the switch 24 will be detected even when the knob 20 is turned rapidly. This is important since if a single click is missed, the knob detection routine will be mislead and the volume change may be in the wrong direction.

In each control loop, a valid knob position<40> is tested<40>. If the inputs to the microcomputer 28 are not in sequence 0 11, 101, 110, or 110, 101, 0 1 1 the program returns to the main loop. If the knob position is valid, the processor tests for a change of position of the knob<42>. If the knob position is the same as in the previous loop, a counter B is incremented <44>, and if the counter number B is less than ten<46>, the control returns to the main loop. If the switch position has not changed and the counter B number reaches ten, indicating that fifty milliseconds has elapsed since counter B was reset, and click counter A equals zero<47>, then counter B and a click counter A are cleared to zero <48> before the routine returns to the main loop.

If the switch position has changed since the last loop <42>, counter B is cleared<50> and the click counter A is then incremented by one count <52>. Clearing of counter B when a click is detected assures that counter B will not time out for at least another fifty milliseconds, thereby allowing time for still another click to be registered. The program therefore includes a fifty millisecond sampling time over which to accumulate counts in click counter A. The number of clicks accumulated in the click counter A during the sampling time period of fifty milliseconds is used to calculate the click rate<53> which in turn is used to look up the table value<54>. The click rate is then used to access the appropriate look-up table to determine the net change<54> in the volume control signal.

A routine compares the present microcomputer input to that of the previous click to determine the direction the control knob 20 is turning<56>. As the knob 20 is turned counter-clockwise, the new volume signal is equal to the old volume minus the volume net increment from the look-up table 38 <58>. If the knob 20 is rotated clockwise, the new volume is equal to the old volume plus the volume net increment<60>.

The new volume is output on the control data bus 14 <62> to command the volume change. The new volume value is assigned to the old volume<64>. Click counter A and counter B are then cleared to zero<48> before the routine returns to the main loop. Thus, each time rotation of knob 20 is detected and the sampling period has elapsed, the number accumulated in click counter A is used to determine the rate and the volume is updated by the table value which corresponds to the accumulated count. By tailoring the look-up table 38 to a particular application, a desired rate of volume change can be obtained.

The counter B is used to determine when the rotation of control knob 20 has stopped and click counter A is cleared in readiness for another rotation. It is assumed that the continued switch rotation will result in less than a fifty millisecond time lapse between clicks. If in fact the switch rotation has not stopped but is continuing so slowly that counter B times out after each click, then each click will result in a click counter A count of one which results in a volume increment of one which provides for fine adjustment.

A plurality of look-up tables 38 are stored in the memory 36 and one of the look-up tables is selected for use according to the determination of rate of change of rotation as produced in response to the number of clicks over a given sampling time period. FIG. 4 provides one example of the use of volume control and the selection of the look-up table 38 where the volume ranges from between zero to sixty-three digital numbers. This particular example provides for three rates including rate 1, rate 2 and rate 3 as previously discussed which are divided into high, medium and low ranges. The table value subroutine <54> as shown in FIG. 3 would include the step of selecting look-up table No. 1 <70> if the calculated click rate<53> is less than rate 1 <72>, selecting look-up table No. 3 <74> if the calculated click rate is greater than rate 2 <76>, or otherwise selecting table No. 2 <78>. The selected look-up table is then used to look up the net change in the volume control signal according to the value generated by click counter A <80> over the fifty millisecond sampling time.

It will be appreciated that other parameters such as direction or rate of control knob rotation could be used alone or in logical combination with other parameters to accommodate the desired table selection. Look-up tables 38 are preferably tailored for a given application to achieve a desired response for providing control switch rotation. While a plurality of look-up tables 38 are shown, a user may likewise employ other functions such as an equation to provide variable predetermined changes in the digital output to attain linear or non-linear responses to the switch movement.

The present invention is particularly useful for providing variable amounts of change. For instance, with the volume control arrangement, a user may find that a car radio was left set with a volume control set at maximum. The user may start the vehicle and experience an uncomfortable sound level from which the user would like to turn the volume down as soon as possible. To reduce the volume to minimum audio levels may require sixty-four steps in current electronic hardware. Without the present invention, state of the art rotary controls may require four full turns of 1440 degrees of control rotation in order to accomplish this. Since the human hand can turn a control approximately 270 degrees per crank before repositioning the hand to crank again, this figures it would take 5.33 cranks of the hand. This is a significant amount of time when the user's ears are exposed to full volume. Therefore, the user may use the present invention to quickly rotate the control knob 20 thereby providing an enlarged increment in volume output with one crank of the hand by turning the control knob 20 rapidly, while allowing a user to achieve fine adjustment with a slower rotation of control knob 20.

While this invention has been disclosed in connection with a particular example thereof, no limitation is intended thereby except as defined in the following claims. This is because a skilled practitioner recognizes that other modifications can be made without departing from the spirit of this invention after studying the specification and drawings.

What is claimed is:

1. A control apparatus for providing a variable control signal to an electronic device comprising:

a digital switch movable to a plurality of positions and having a plurality of digital outputs to represent said positions;

memory means for storing control increment values which correspond to an amount of change of position and rate of change of position of said switch;

means for periodically sampling the switch output to determine switch movement;

means for determining the direction of switch movement from a sequence of the digital outputs;

means for counting an amount of change in position of the switch over a sampling time so as to determine a rate of change of position of the switch;

means for looking up a control increment value from the memory means that corresponds to the change in position of the switch and rate of change of position of the switch, wherein control increment values increases with increasing rate of change of position of the switch so that an increased rate of change of position of the switch results in an increased control increment value corresponding to the change in position of the switch; and means for changing the control signal by the control increment value.

2. The control apparatus as described in claim 1 wherein said memory means includes a plurality of look-up tables for storing said control increments as a function of the amount of change of position, each look-up table corresponding to a different predetermined range for the rate of change of position of the switch and containing a different function defining control increments for the amount of change of position of the switch.

3. The control apparatus as defined in claim 1 wherein the electronic device comprises a radio and said digital switch controls the volume function.

4. A control apparatus as defined by claim 1 wherein said electronic device comprises a radio and the digital switch controls the tuning thereof.

5. A control apparatus for providing a variable volume control signal to an electronic radio comprising:

a digital rotary switch movable to a plurality of positions and having a plurality of digital outputs to represent said positions;

memory means for storing control increments which correspond to a plurality of rates of rotation of the rotary switch;

means for periodically sampling the switch output to detect switch movement;

means for determining the direction of rotation of said switch from a sequence of the digital outputs;

means for counting a number of changes in position of the switch over a sampling time so as to generate a rate of rotation of the switch;

means for looking up an amount of change in the volume control signal from the memory means as a function of the rate of rotation of switch movement; and means for changing the volume control signal by the amount of change, wherein in the volume control signal is changed at an increasing rate as the rate of rotation of the switch movement increases.

6. A control apparatus for providing a tuner control signal to an electronic radio comprising:

a digital rotary switch movable to a plurality of positions and having a plurality of digital outputs to represent said positions;

memory means for storing control increments for a plurality of predetermined rates of rotation of the switch;

means for periodically sampling the switch output to detect switch movement;

means for determining a direction of switch rotation from a sequence of the digital outputs of the switch;

means for counting changes in position of the switch over a sampling time so as to determine a rate of rotation of the switch;

means for looking up an amount of change in the tuner control signal that corresponds to the rate of rotation of the switch from the memory means; and means for changing the tuner control signal by an amount as a function of the amount of change, wherein the tuner control signal is changed at an increasing rate as the rate of change of rotation of the switch increases.

7. A method for variably controlling a control signal for an electronic device in response to a rotary switch comprising:

storing control increments in memory which correspond to amounts of rotation and rates of rotation of the rotary switch;

manually rotating a digital rotary switch to a plurality of positions which have a plurality of digital outputs to represent said positions so as to control functions for the electronic device;

periodically sampling the switch output to determine switch movement;

determining the direction of switch rotation from a sequence of the digital outputs produced by the switch;

counting the number of changes in switch position over a sampling time to determine the rate of change of the switch movement;

looking up an amount of change in the control output from the memory based upon the number of changes in position and rate of rotation of said switch; and changing the control signal by the amount of change in the control signal, where the rate of changing the control signal increases as the rate of change of the switch movement increase.

8. The method as defined in claim 7 wherein the control signal comprises a volume control signal for selecting the frequency of operation of an electronic radio.

9. The method as defined in claim 7 wherein the control signal comprises a tuner selector signal for selecting the frequency of operation of an electronic radio.

* * * * *